United States Patent
Schmitt

(10) Patent No.: US 7,910,897 B2
(45) Date of Patent: *Mar. 22, 2011

(54) PROCESS AND APPARATUS FOR POST DEPOSITION TREATMENT OF LOW DIELECTRIC MATERIALS

(75) Inventor: Francimar C. Schmitt, Santa Clara, CA (US)

(73) Assignee: Applied Materials, Inc., Santa Clara, CA (US)

(*) Notice: Subject to any disclaimer, the term of this patent is extended or adjusted under 35 U.S.C. 154(b) by 141 days.

This patent is subject to a terminal disclaimer.

(21) Appl. No.: 11/923,233

(22) Filed: Oct. 24, 2007

(65) Prior Publication Data

US 2008/0042077 A1 Feb. 21, 2008

Related U.S. Application Data

(62) Division of application No. 11/123,265, filed on May 5, 2005.

(60) Provisional application No. 60/569,373, filed on May 6, 2004.

(51) Int. Cl.
*G01N 21/00* (2006.01)

(52) U.S. Cl. .......... 250/453.11; 250/455.11; 250/504 R

(58) Field of Classification Search .......... 250/455.11, 250/492.22, 504 R, 453.11; 438/788; 137/9
See application file for complete search history.

(56) References Cited

U.S. PATENT DOCUMENTS

| | | | |
|---|---|---|---|
| 3,983,039 A | 9/1976 | Eastland | |
| 4,135,098 A | 1/1979 | Troue | |
| 4,411,931 A | 10/1983 | Duong | |
| 4,911,103 A * | 3/1990 | Davis et al. | 118/725 |
| 5,136,170 A | 8/1992 | Gellert | |
| 5,228,206 A | 7/1993 | Grant et al. | |
| 5,422,488 A * | 6/1995 | Baier et al. | 250/453.11 |
| 5,440,137 A | 8/1995 | Sowers | |
| 5,705,232 A | 1/1998 | Hwang et al. | |
| 5,722,761 A | 3/1998 | Knight | |
| 5,812,403 A | 9/1998 | Fong et al. | |
| 5,885,751 A | 3/1999 | Weidman et al. | |

(Continued)

FOREIGN PATENT DOCUMENTS

DE 102 41 330 9/2003

(Continued)

OTHER PUBLICATIONS

Waldfried, Carlo, Han, Qingyuan, Escorcia, Orlando, Margolis, Ari, Albano, Ralph, and Berry, Ivan, "Single Wafer RapidCuring™ of Porous Low-k Materials", Axcelis Technologies, Inc., 2002 IEEE, 0-7803-7216/02, pp. 226-228.

(Continued)

*Primary Examiner* — Nikita Wells
*Assistant Examiner* — Johnnie L Smith
(74) *Attorney, Agent, or Firm* — Patterson & Sheridan, LLP

(57) ABSTRACT

Methods and apparatus are provided for processing a substrate with an ultraviolet curing process. In one aspect, the invention provides a method for processing a substrate including depositing a silicon carbide dielectric layer on a substrate surface and curing the silicon carbide dielectric layer with ultra-violet curing radiation. The silicon carbide dielectric layer may comprise a nitrogen containing silicon carbide layer, an oxygen containing silicon carbide layer, or a phenyl containing silicon carbide layer. The silicon carbide dielectric layer may be used as a barrier layer, an etch stop, or as an anti-reflective coating in a damascene formation technique.

19 Claims, 4 Drawing Sheets

U.S. PATENT DOCUMENTS

| | | | |
|---|---|---|---|
| 5,906,042 | A | 5/1999 | Lan et al. |
| 5,909,994 | A * | 6/1999 | Blum et al. ............... 414/217 |
| 5,911,834 | A * | 6/1999 | Fairbairn et al. ............ 134/1.3 |
| 5,973,331 | A | 10/1999 | Stevens et al. |
| 6,013,330 | A | 1/2000 | Lutz |
| 6,054,379 | A | 4/2000 | Yau et al. |
| 6,098,637 | A | 8/2000 | Parke |
| 6,178,973 | B1 | 1/2001 | Franca et al. |
| 6,201,219 | B1 | 3/2001 | Sandhu et al. |
| 6,224,934 | B1 * | 5/2001 | Hasei et al. ............... 427/10 |
| 6,225,745 | B1 | 5/2001 | Srivastava |
| 6,238,844 | B1 | 5/2001 | Joubert et al. |
| 6,259,072 | B1 | 7/2001 | Kinnard et al. |
| 6,264,802 | B1 | 7/2001 | Kamrukov et al. |
| 6,265,830 | B1 | 7/2001 | Bretmersky et al. |
| 6,284,050 | B1 | 9/2001 | Shi et al. |
| 6,303,523 | B2 | 10/2001 | Cheung et al. |
| 6,319,809 | B1 | 11/2001 | Chang et al. |
| 6,323,601 | B1 | 11/2001 | Klein et al. |
| 6,331,480 | B1 | 12/2001 | Tsai et al. |
| 6,380,270 | B1 | 4/2002 | Yates |
| 6,406,836 | B1 | 6/2002 | Mohondro et al. |
| 6,457,846 | B2 | 10/2002 | Cook et al. |
| 6,458,430 | B1 | 10/2002 | Bernstein et al. |
| 6,475,930 | B1 | 11/2002 | Junker et al. |
| 6,503,693 | B1 | 1/2003 | Mohondro et al. |
| 6,504,379 | B1 | 1/2003 | Jackson |
| 6,511,909 | B1 | 1/2003 | Yau et al. |
| 6,524,936 | B2 | 2/2003 | Hallock et al. |
| 6,528,891 | B2 | 3/2003 | Lin |
| 6,537,733 | B2 * | 3/2003 | Campana et al. ............ 430/313 |
| 6,559,460 | B1 | 5/2003 | Keogh et al. |
| 6,566,278 | B1 | 5/2003 | Harvey et al. |
| 6,585,908 | B2 | 7/2003 | Cardoso et al. |
| 6,589,715 | B2 | 7/2003 | Joubert et al. |
| 6,591,850 | B2 * | 7/2003 | Rocha-Alvarez et al. ........ 137/9 |
| 6,593,699 | B2 | 7/2003 | Lagos |
| 6,597,003 | B2 | 7/2003 | Janos et al. |
| 6,605,484 | B2 | 8/2003 | Janos et al. |
| 6,610,169 | B2 | 8/2003 | Nguyen et al. |
| 6,614,181 | B1 | 9/2003 | Harvey et al. |
| 6,619,819 | B2 | 9/2003 | Stowell et al. |
| 6,623,133 | B1 | 9/2003 | Keogh |
| 6,631,726 | B1 | 10/2003 | Kinoshita et al. |
| 6,635,117 | B1 | 10/2003 | Kinnard et al. |
| 6,657,205 | B1 | 12/2003 | Wong |
| 6,663,792 | B2 | 12/2003 | Fayfield et al. |
| 6,664,737 | B1 | 12/2003 | Berry et al. |
| 6,696,801 | B2 | 2/2004 | Schmitkons et al. |
| 6,709,807 | B2 | 3/2004 | Hallock et al. |
| 6,732,451 | B2 | 5/2004 | Conwell et al. |
| 6,734,120 | B1 | 5/2004 | Berry et al. |
| 6,753,506 | B2 | 6/2004 | Liu et al. |
| 6,756,085 | B2 * | 6/2004 | Waldfried et al. ............ 427/515 |
| 6,759,321 | B2 | 7/2004 | Babich et al. |
| 6,759,327 | B2 | 7/2004 | Xia et al. |
| 6,761,796 | B2 | 7/2004 | Srivastava et al. |
| 6,818,864 | B2 * | 11/2004 | Ptak ............... 219/390 |
| 6,893,985 | B2 | 5/2005 | Goodner |
| 7,030,045 | B2 * | 4/2006 | Johnson ............... 438/788 |
| 7,079,740 | B2 * | 7/2006 | Vandroux et al. ............ 385/129 |
| 7,081,638 | B1 | 7/2006 | Augur |
| 7,087,482 | B2 | 8/2006 | Yeo et al. |
| 7,098,149 | B2 | 8/2006 | Lukas et al. |
| 7,128,806 | B2 * | 10/2006 | Nguyen et al. ............ 156/345.51 |
| 7,265,061 | B1 | 9/2007 | Cho et al. |
| 7,288,205 | B2 * | 10/2007 | Lakshmanan et al. ........ 216/67 |
| 7,663,121 | B2 * | 2/2010 | Nowak et al. ............ 250/455.11 |
| 2002/0020429 | A1 * | 2/2002 | Selbrede et al. ............ 134/1.1 |
| 2002/0073922 | A1 | 6/2002 | Frankel et al. |
| 2002/0106500 | A1 | 8/2002 | Albano et al. |
| 2003/0015223 | A1 | 1/2003 | Jacksier et al. |
| 2003/0015669 | A1 | 1/2003 | Janos et al. |
| 2003/0020027 | A1 | 1/2003 | Danvers |
| 2003/0037802 | A1 | 2/2003 | Nakahara et al. |
| 2003/0054115 | A1 | 3/2003 | Albano et al. |
| 2003/0102491 | A1 | 6/2003 | Yang et al. |
| 2003/0111438 | A1 | 6/2003 | Mukai et al. |
| 2003/0139035 | A1 | 7/2003 | Yim et al. |
| 2003/0205553 | A1 | 11/2003 | Nakahara et al. |
| 2004/0021428 | A1 | 2/2004 | Swami et al. |
| 2004/0055636 | A1 * | 3/2004 | Rocha-Alvarez et al. ........ 137/9 |
| 2004/0058090 | A1 | 3/2004 | Waldfried et al. |
| 2004/0065852 | A1 | 4/2004 | Harrell et al. |
| 2004/0096593 | A1 | 5/2004 | Lukas et al. |
| 2004/0096672 | A1 | 5/2004 | Lukas et al. |
| 2004/0099283 | A1 | 5/2004 | Waldfried et al. |
| 2004/0113089 | A1 | 6/2004 | Janos et al. |
| 2004/0155591 | A1 | 8/2004 | Schmitkons et al. |
| 2004/0166140 | A1 * | 8/2004 | Santini et al. .................. 424/424 |
| 2004/0175501 | A1 | 9/2004 | Lukas et al. |
| 2004/0175957 | A1 | 9/2004 | Lukas et al. |
| 2004/0183481 | A1 | 9/2004 | Borsuk et al. |
| 2004/0192058 | A1 | 9/2004 | Chu et al. |
| 2005/0040341 | A1 | 2/2005 | Schmitkons |
| 2005/0042889 | A1 * | 2/2005 | Lee et al. ............ 438/780 |
| 2005/0064298 | A1 | 3/2005 | Silverman |
| 2005/0064726 | A1 | 3/2005 | Reid et al. |
| 2005/0082007 | A1 * | 4/2005 | Nguyen et al. ............ 156/345.51 |
| 2005/0133158 | A1 * | 6/2005 | Nguyen et al. ............ 156/345.31 |
| 2005/0150452 | A1 * | 7/2005 | Sen et al. ............ 118/715 |
| 2005/0196971 | A1 * | 9/2005 | Sen et al. ............ 438/778 |
| 2005/0241579 | A1 * | 11/2005 | Kidd ............... 118/715 |
| 2005/0263719 | A1 | 12/2005 | Ohdaira et al. |
| 2006/0006140 | A1 * | 1/2006 | Lakshmanan et al. .......... 216/67 |
| 2006/0141806 | A1 | 6/2006 | Waldfried et al. |
| 2006/0165904 | A1 | 7/2006 | Ohara |
| 2006/0249078 | A1 | 11/2006 | Nowak et al. |
| 2006/0249175 | A1 | 11/2006 | Nowak et al. |
| 2006/0251827 | A1 * | 11/2006 | Nowak et al. .................. 427/558 |
| 2007/0228289 | A1 | 10/2007 | Kaszuba et al. |
| 2007/0228618 | A1 | 10/2007 | Kaszuba et al. |
| 2007/0257205 | A1 | 11/2007 | Rocha-Alvarez et al. |
| 2007/0278419 | A1 * | 12/2007 | Zani et al. .................. 250/432 R |
| 2007/0278428 | A1 * | 12/2007 | Zani et al. .................. 250/492.22 |
| 2007/0295012 | A1 | 12/2007 | Ho et al. |
| 2008/0067425 | A1 | 3/2008 | Kaszuba et al. |

FOREIGN PATENT DOCUMENTS

| | | |
|---|---|---|
| EP | 0 675 211 | 10/1995 |
| JP | 04 225521 | 8/1992 |
| JP | 09 120950 | 5/1997 |
| JP | 11 111713 | 4/1999 |

OTHER PUBLICATIONS

<http://www.nordson.com/Businesses/UV/IndustrialUV/>, Industrial UV Systems, Nordson's CoolWave™, Apr. 7, 2005.

http://www.nordson.com/Businesses/UV/PrimarcLamps/ <http://www.nordson.com/Businesses/UV/IndustrialUV/>, Primarc UV Curing Lamps, Apr. 7, 2005.

<http://www.nordson.com/Businesses/UV/IndustrialUV/>, CoolWave® Systems, Apr. 7, 2005.

PCT International Search Report dated Sep. 25, 2006.

Vig, John. Handbook of Semiconductor Wafer Cleaning Technology. Noyes Publications, 1993. Chapter 6:233-273.

* cited by examiner

PROCESS AND APPARATUS FOR POST DEPOSITION TREATMENT OF LOW DIELECTRIC MATERIALS

CROSS-REFERENCE TO RELATED APPLICATIONS

This application is a divisional of co-pending U.S. patent application Ser. No. 11/123,265, filed May 5, 2005, which claims benefit of U.S. provisional patent application Ser. No. 60/569,373, filed May 6, 2004. Each of the aforementioned related patent applications is herein incorporated by reference.

BACKGROUND OF THE INVENTION

1. Field of the Invention

The invention relates to the fabrication of integrated circuits, more specifically to a process for forming dielectric layers on a substrate, and to the structures formed by the dielectric layer.

2. Description of the Related Art

Semiconductor device geometries have dramatically decreased in size since such devices were first introduced several decades ago. Since then, integrated circuits have generally followed the two year/half-size rule (often called Moore's Law), which means that the number of devices that will fit on a chip doubles every two years. Today's fabrication plants are routinely producing devices having 0.35 µm and even 0.18 µm feature sizes, and tomorrow's plants soon will be producing devices having even smaller geometries.

To further reduce the size of devices on integrated circuits, it has become necessary to use conductive materials having low resistivity and to use insulators having low dielectric constants (dielectric constants of less than 4.0) to also reduce the capacitive coupling between adjacent metal lines. One such low k material is silicon oxycarbide deposited by a chemical vapor deposition process and silicon carbide, both of which may be used as dielectric materials in fabricating damascene features.

One conductive material having a low resistivity is copper and its alloys, which have become the materials of choice for sub-quarter-micron interconnect technology because copper has a lower resistivity than aluminum, (1.7 µΩ-cm for copper compared to 3.1 µΩ-cm for aluminum), a higher current and higher carrying capacity. These characteristics are important for supporting the higher current densities experienced at high levels of integration and increased device speed. Further, copper has a good thermal conductivity and is available in a highly pure state.

One difficulty in using copper in semiconductor devices is that copper is difficult to etch and achieve a precise pattern. Etching with copper using traditional deposition/etch processes for forming interconnects has been less than satisfactory. Therefore, new methods of manufacturing interconnects having copper containing materials and low k dielectric materials are being developed.

One method for forming vertical and horizontal interconnects is by a damascene or dual damascene method. In the damascene method, one or more dielectric materials, such as the low k dielectric materials, are deposited and pattern etched to form the vertical interconnects, for example, vias, and horizontal interconnects, for example, lines. Conductive materials, such as copper containing materials, and other materials, such as barrier layer materials used to prevent diffusion of copper containing materials into the surrounding low k dielectric, are then inlaid into the etched pattern. Any excess copper containing materials and excess barrier layer material external to the etched pattern, such as on the field of the substrate, is then removed.

However, low k dielectric materials are often porous and susceptible to interlayer diffusion of conductive materials, such as copper, which can result in the formation of short-circuits and device failure. A dielectric barrier layer material is often disposed between the copper material and surrounding the low k material to prevent interlayer diffusion. However, traditional dielectric barrier layer materials, such as silicon nitride, often have high dielectric constants of 7 or greater. The combination of such a high k dielectric material with surrounding low k dielectric materials results in dielectric stacks having a higher than desired dielectric constant.

Further when silicon oxycarbide layers or silicon carbide layers that contain nitrogen are used as the low k material in damascene formation, it can be difficult to produced aligned features with little or no defects. It has also been observed that resist materials deposited on the silicon oxycarbide layers or the silicon carbide layers may be contaminated with nitrogen deposited with the silicon oxycarbide layers or the silicon carbide layers or from nitrogen diffusing therethrough. For example, reaction of organosilicon compounds with nitrous oxide can contaminate the silicon oxycarbide layer with nitrogen or the nitrogen in nitrogen-doped silicon carbide layers may diffuse through adjacent layers as amine radicals ($-NH_2$) to react with the resist materials.

Resist materials contaminated with nitrogen becomes less sensitive to radiation. Resist material exposed to other compounds, such as basic radicals including hydroxyl groups ($-OH$) may also decrease the sensitivity of the resist material. The decrease in the sensitivity to radiation is referred to as "resist poisoning". Any resist material that is not sensitive to radiation is not removed by subsequent resist stripping processes and remains as residue. The remaining residue of resist material is referred to as "footing". This residue can result in detrimentally affecting subsequent etching processes and result in misaligned and malformed features.

Therefore, there remains a need for an improved process for depositing dielectric material and resist materials for layering techniques, such as damascene applications.

SUMMARY OF THE INVENTION

Aspects of the invention generally provide a method for depositing and treating a dielectric material having a low dielectric constant as a barrier layer, an etch stop, or an anti-reflective coating. In one aspect, the invention provides a method for processing a substrate including depositing a silicon carbide dielectric layer on a substrate surface and curing the silicon carbide dielectric layer with ultra-violet curing radiation.

In another aspect, the invention provides a method for processing a substrate including depositing a first dielectric layer on the substrate by introducing a processing gas comprising a nitrogen containing compound and an organosilicon compound into a processing chamber, reacting the processing gas to deposit a first dielectric layer, wherein the first dielectric layer comprises silicon, carbon, and nitrogen, and has a dielectric constant less than 5, and curing the first dielectric layer with ultra-violet curing radiation.

In another aspect, a method is provided for processing a substrate including depositing a nitrogen-doped dielectric layer on the substrate, curing the nitrogen-doped dielectric layer with ultra-violet radiation, depositing a dielectric layer comprising silicon, oxygen, and carbon, on the nitrogen-doped dielectric layer, depositing a resist on the dielectric layer comprising silicon, oxygen, and carbon.

In another aspect, an apparatus is provided for processing a substrate including a tandem-process chamber and a source of ultraviolet radiation disposed on the tandem-processing chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings.

It is to be noted, however, that the appended drawings illustrate only typical embodiments of this invention and are therefore not to be considered limiting of its scope, for the invention may admit to other equally effective embodiments.

For a further understanding of aspect of the invention, reference should be made to the ensuing detailed description.

DETAILED DESCRIPTION

Figure 3:
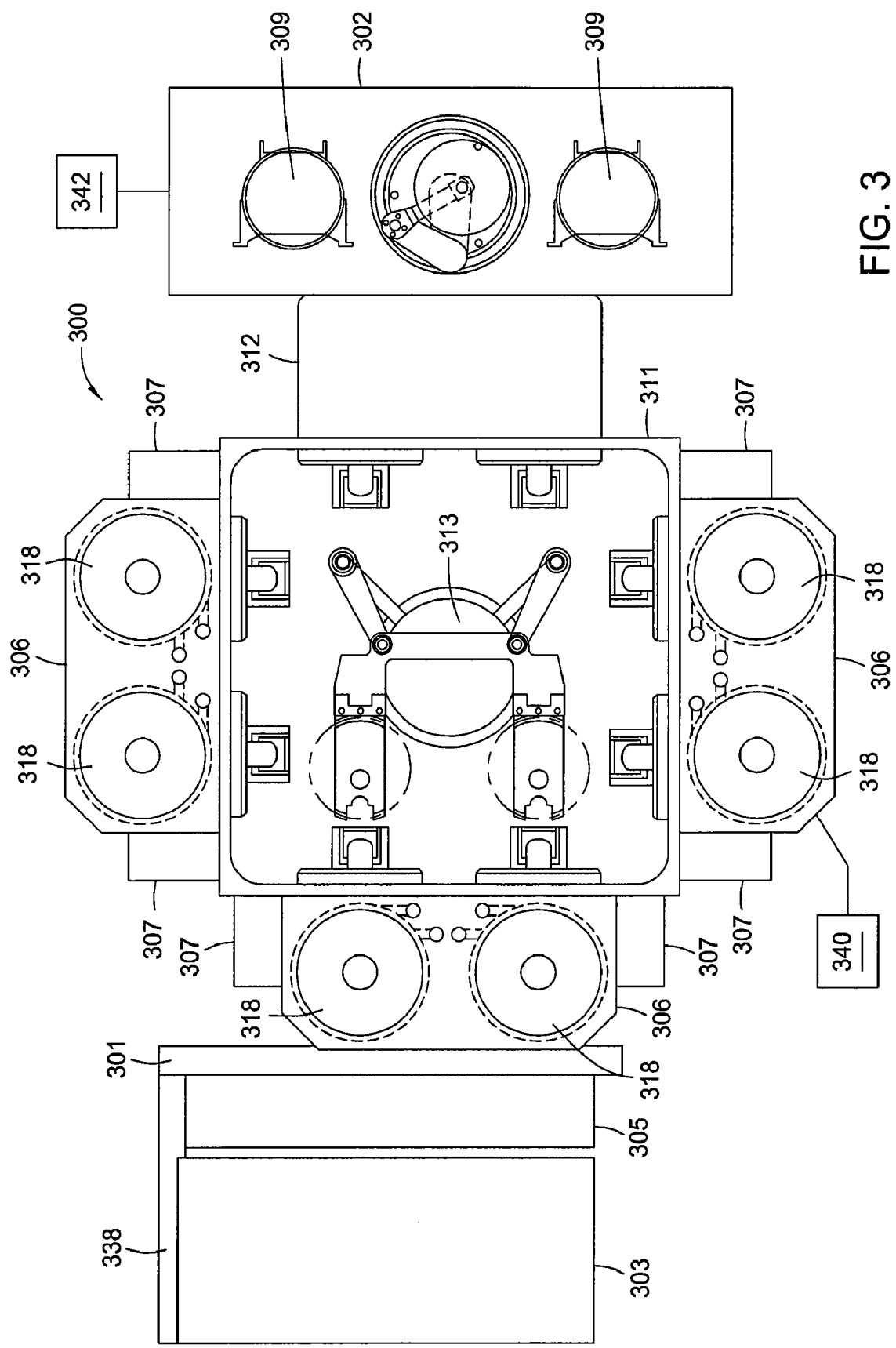
FIG. 3 is a plan view of one embodiment of a tandem semiconductor processing system.

The words and phrases used herein should be given their ordinary and customary meaning in the art by one skilled in the art unless otherwise further defined. The following deposition processes are described with use of the 300 mm Producer™ dual deposition station processing chamber commercially available from Applied Materials Inc., of Santa Clara, Calif., of which one example is shown in FIG. 3, and should be interpreted accordingly where appropriate. For example, flow rates for the Producer™ processing chamber are total flow rates and should be divided by two to describe the process flow rates at each deposition station in the processing chamber. Additionally, it should be noted that the respective parameters may be modified to perform the plasma processes in various chambers and for different substrate sizes, such as for 200 mm substrates. Process parameters for the exposure to the ultraviolet radiation may occur in the Producer™ processing chamber or separate chamber or separate system.

Aspects of the invention described herein refer to a method and apparatus for depositing a silicon carbide containing layer having a low dielectric constant, such as a nitrogen doped silicon carbide, and treating the surface of the silicon carbide containing layer with an ultraviolet curing process. Treating of the surface of the silicon carbide containing material is believed to improve barrier properties, densify the silicon carbide containing material, limit the migration of nitrogen contaminants from the deposited material or limit the ability of nitrogen from reacting with the resist material, remove nitrogen containing compounds from the deposited material, and reduce the dielectric constant of the silicon carbide containing material. Treating the surface may further include a plasma treatment or e-beam treatment. The surface treated with the ultraviolet curing process has been observed to be less reactive with the subsequently deposited resist material thereby limiting resist poisoning and reduce defect formation when forming features in the dielectric layer. While the following description is directed to depositing and treating a nitrogen doped dielectric layer, the invention contemplates depositing and treating nitrogen free dielectric layers, such as oxygen-doped silicon carbide and silicon carbide deposited from phenyl containing precursors as described herein.

Silicon Carbide Deposition

Silicon carbide layer may be deposited by reacting a processing gas of an organosilicon compound. Silicon carbide layer include a nitrogen containing silicon carbide layer, an oxygen containing silicon carbide layer, or a phenyl containing silicon carbide layer. The silicon carbide layer may be deposited with an organosilicon compound and a reactive gas. For example, nitrogen-doped silicon carbide layers may be deposited by reacting a processing gas of the organosilicon compound and a nitrogen containing compound. The processing gas may include additional reactive compounds such as hydrogen gas. The processing gas may also include an inert gas including helium, argon, or combinations thereof.

Suitable organosilicon compounds for depositing silicon carbide materials include oxygen-free organosilicon compounds. Examples of oxygen free organosilicon compounds include phenylsilanes and aliphatic organosilicon compounds. Examples of suitable organosilicon compounds used herein for silicon carbide deposition preferably include the structure:

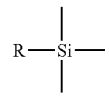

wherein R includes hydrogen atoms or organic functional groups including alkyl, alkenyl, cyclical, such as cyclohexyl, and aryl groups, in addition to functional derivatives thereof. The organosilicon compounds may have more than one R group attached to the silicon atom, and the invention contemplates the use of organosilicon compounds with or without Si—H bonds.

Suitable oxygen-free organosilicon compounds include oxygen-free aliphatic organosilicon compounds, oxygen-free cyclic organosilicon compounds, or combinations thereof, having at least one silicon-carbon bond. Cyclic organosilicon compounds typically have a ring comprising three or more silicon atoms. Aliphatic organosilicon compounds have linear or branched structures comprising one or more silicon atoms and one or more carbon atoms. Commercially available aliphatic organosilicon compounds include alkylsilanes. Fluorinated derivatives of the organosilicon compounds described herein may also be used to deposit the silicon carbide and silicon oxycarbide layers described herein. Methylsilanes are preferred organosilicon compounds for silicon carbide deposition.

Examples of suitable organosilicon compounds include, for example, one or more of the following compounds:

| | |
|---|---|
| Methylsilane, | $CH_3$—$SiH_3$ |
| Dimethylsilane, | $(CH_3)_2$—$SiH_2$ |
| Trimethylsilane (TMS), | $(CH_3)_3$—$SiH$ |
| Tetramethylsilane, | $(CH_3)_4$—$Si$ |
| Ethylsilane, | $CH_3$—$CH_2$—$SiH_3$ |
| Disilanomethane, | $SiH_3$—$CH_2$—$SiH_3$ |
| Bis(methylsilano)methane, | $CH_3$—$SiH_2$—$CH_2$—$SiH_2$—$CH_3$ |
| 1,2-disilanoethane, | $SiH_3$—$CH_2$—$CH_2$—$SiH_3$ |
| 1,2-bis(methylsilano)ethane, | $CH_3$—$SiH_2$—$CH_2$—$CH_2$—$SiH_2$—$CH_3$ |
| 2,2-disilanopropane, | $SiH_3$—$C(CH_3)_2$—$SiH_3$ |

-continued

| | |
|---|---|
| 1,3,5-trisilano-2,4,6-trimethylene, | —(—SiH$_2$—CH$_2$—)$_3$-(cyclic) |
| Diethylsilane | (C$_2$H$_5$)$_2$SiH$_2$ |
| Diethylmethylsilane | (C$_2$H$_5$)$_2$SiH(CH$_3$) |
| Propylsilane | C$_3$H$_7$SiH$_3$ |
| Vinylmethylsilane | (CH$_2$=CH)(CH$_3$)SiH$_2$ |
| Divinyldimethylsilane (DVDMS) | (CH$_2$=CH)$_2$(CH$_3$)$_2$Si |
| 1,1,2,2-tetramethyldisilane | HSi(CH$_3$)$_2$—Si(CH$_3$)$_2$H |
| Hexamethyldisilane | (CH$_3$)$_3$Si—Si(CH$_3$)$_3$ |
| 1,1,2,2,3,3-hexamethyltrisilane | H(CH$_3$)$_2$Si—Si(CH$_3$)$_2$—SiH(CH$_3$)$_2$ |
| 1,1,2,3,3-pentamethyltrisilane | H(CH$_3$)$_2$Si—SiH(CH$_3$)—SiH(CH$_3$)$_2$ |
| Dimethyldisilanoethane | CH$_3$—SiH$_2$—(CH$_2$)$_2$—SiH$_2$—CH$_3$ |
| Dimethyldisilanopropane | CH$_3$—SiH$_2$—(CH$_2$)$_3$—SiH$_2$—CH$_3$ |
| Tetramethyldisilanoethane | (CH)$_2$—SiH—(CH$_2$)$_2$—SiH—(CH)$_2$ |
| Tetramethyldisilanopropane | (CH$_3$)$_2$—SiH—(CH$_2$)$_3$—SiH—(CH$_3$)$_2$ |

Suitable organosilicon compounds further include alkyl and/or cyclical organosilicon compounds having carbon to silicon atom ratios (C:Si) of 5:1 or greater, such as 8:1 or 9:1. Alkyl functional groups having higher carbon alkyl groups, such as ethyl and iso-propyl functional groups, for example, dimethylisopropylsilane (5:1), diethylmethylsilane (5:1), tetraethylsilane (8:1), dibutylsilanes (8:1), tripropylsilanes (9:1), may be used. Cyclical organosilicons, such as cyclopentylsilane (5:1) and cyclohexylsilane (6:1), including cyclical compounds having alkyl groups, such as ethylcyclohexylsilane (8:1) and propylcyclohexylsilanes (9:1) may also be used for the deposition of silicon carbon layers.

Phenyl containing organosilicon compounds, such as phenylsilanes may also be used for depositing the silicon carbide materials and generally include the structure:

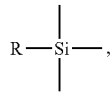

wherein R is a phenyl group. For example, suitable phenyl containing organosilicon compounds generally include the formula SiH$_a$(CH$_3$)$_b$(C$_6$H$_5$)$_c$, wherein a is 0 to 3, b is 0 to 3, and c is 1 to 4, and a+b+c is equal to 4. Examples of suitable compounds derived from this formula include diphenylsilane (DPS), dimethylphenylsilane (DMPS), diphenylmethylsilane, phenylmethylsilane, and combinations thereof. Preferably used are phenyl containing organosilicon compounds with b is 1 to 3 and c is 1 to 3. The most preferred phenyl organosilicon compounds for deposition as barrier layer materials include organosilicon compounds having the formula SiH$_a$(CH$_3$)$_b$(C$_6$H$_5$)$_c$, wherein a is 1 or 2, b is 1 or 2, and c is 1 or 2. Examples of preferred phenyl compounds include dimethylphenylsilane and diphenylmethylsilane.

An example of a phenyl containing silicon carbide deposition process includes supplying dimethylphenylsilane, to a plasma processing chamber at a flow rate between about 10 milligrams/minute (mgm) and about 1500 mgm, for example, about 750 mgm, supplying hydrogen gas at a flow rate between about 10 sccm and about 2000 sccm, for example, about 500 sccm, supplying an inert gas at a flow rate between about 10 sccm and about 10000 sccm, for example, about 1500 sccm, maintaining a substrate temperature between about 0° C. and about 500° C., for example, about 350° C., maintaining a chamber pressure below about 500 Torr, for example, about 6 Torr, and an RF power of between about 0.03 watts/cm$^2$ and about 1500 watts/cm$^2$, for example, about 200 watts at a gas distributor positioned between about 300 mils and about 600 mils, for example, about 450 mils, form the substrate surface during the deposition process.

The RF power can be provided at a high frequency, such as between 13 MHz and 14 MHz. The RF power can be provided continuously or in short duration cycles wherein the power is on at the stated levels for cycles less than about 200 Hz and the on cycles total between about 10% and about 30% of the total duty cycle. The processing gas may be introduced into the chamber by a gas distributor, the gas distributor may be positioned between about 200 mils and about 700 mils from the substrate surface. Additionally, the RF power may also be provided at low frequencies, such as 356 kHz, for depositing silicon carbide material.

Example processes for depositing a phenyl containing silicon carbide layer is disclosed in U.S. Pat. No. 6,759,327, issued on Jul. 6, 2004, and U.S. Pat. No. 6,790,788, issued on Sep. 14, 2004, which are incorporated by reference to the extent not inconsistent with the claims and disclosure described herein.

Nitrogen doped silicon carbide may be deposited by the reaction of the organosilicon compounds described herein with a nitrogen containing compound. The nitrogen containing compound may be a nitrogen-containing gas, for example, ammonia (NH$_3$), a mixture of nitrogen gas and hydrogen gas, or combinations thereof, in the processing gas. The nitrogen doped silicon carbide layer generally includes less than about 20 atomic percent (atomic %) of nitrogen. The nitrogen containing compound may be introduced into the processing chamber at a flow rate between about 50 sccm and about 10,000 sccm. The nitrogen doped silicon carbide layer may further be oxygen doped by the processes described herein.

Alternatively, the nitrogen containing compound may comprise silicon and nitrogen containing compounds. Suitable silicon and nitrogen containing compounds include compounds having Si—N—Si bonding groups, such as silazane compounds, may be used in the processing gas for doping the deposited silicon carbide material with nitrogen. Compounds having bonded nitrogen, such as in the silazane compounds, can improve the hardness of layers as well as reduced the current leakage of the layers. Examples of suitable silazane compounds includes aliphatic compounds, such as hexamethyldisilazane and divinyltetramethyldisilizane, as well as cyclic compounds, such as hexamethylcyclotrisilazane.

One embodiment of a deposition of nitrated silicon carbide layer comprises supplying an organosilicon precursor, for example trimethylsilane, at a flow rate between about 10 sccm and about 1000 sccm, such as between about 50 sccm and about 500 sccm, for example, about 350 sccm, supplying reducing compounds including nitrogen containing compounds, to a processing chamber at a flow rate between about 100 sccm and about 2500 sccm, such as, between about 500 sccm and about 2000 sccm, for example, ammonia at 700 sccm, and optionally, supplying a hydrogen and/or an inert (noble) gas to a processing chamber at a flow rate between about 1 sccm and about 10,000 sccm respectively, for example, about 1200 sccm of helium, optionally supplying an oxygen-containing compound to a processing chamber at a flow rate between about 100 sccm and about 2500 sccm for an oxygen and nitrogen doped silicon carbide layer, for example, between about 500 sccm and about 2000 sccm, maintaining a chamber pressure between about 100 milliTorr and about 100 Torr, such as, between about 2.5 Torr and about 9 Torr, for example, 3.7 Torr, maintaining a heater temperature between about 100° C. and about 500° C., such as between about 250° C. and about 450° C., for example, about 350° C., positioning a gas distributor, or "showerhead", between about 200 mils and about 1000 mils, for example, 280 mils from the substrate surface, and optionally, generating a plasma.

The plasma may be generated by applying a power density ranging between about 0.03 W/cm2 and about 6.4 W/cm2, which is a RF power level of between about 10 W and about 2000 W for a 200 mm substrate, for example, between about 500 W and about 1100 W, for example, 900 watts, at a high frequency such as between 13 MHz and 14 MHz, for example, 13.56 MHz. The plasma may be generated by applying a power density ranging between about 0.01 W/cm$^2$ and about 2.8 W/cm$^2$, which is a RF power level of between about 10 W and about 2000 W for a 300 mm substrate, for example, between about 500 W and about 1100 W at a high frequency such as between 13 MHz and 14 MHz, for example, 13.56 MHz.

The power may be applied from a dual-frequency RF power source a first RF power with a frequency in a range of about 10 MHz and about 30 MHz at a power in a range of about 200 watts to about 1000 watts and at least a second RF power with a frequency in a range of between about 100 KHz and about 500 KHz as well as a power in a range of about 1 watt to about 200 watts. The initiation layer may be deposited for a period of time between about 1 second and 60 seconds, for example between about 1 and about 5 seconds, such as 2 seconds.

Example processes for depositing a nitrogen containing silicon carbide layer is disclosed in U.S. Pat. No. 6,764,958, issued on Jul. 20, 2004, and U.S. Pat. No. 6,537,733, issued on Mar. 25, 2003, which are incorporated by reference to the extent not inconsistent with the claims and disclosure described herein.

The processing gas may further include hydrogen gas (H2) or an inert gas, or combinations thereof. Suitable inert gases include a noble gas selected from the group of argon, helium, neon, xenon, or krypton, and combinations thereof. The hydrogen gas may be added at a molar ratio of organosilicon compound to hydrogen gas of between about 1:1 and about 10:1, such as between about 1:1 and about 6:1. Preferred deposition processes for oxygen-free organosilicon compounds and hydrogen gas has a molar ratio of oxygen-free organosilicon compound to hydrogen gas of between about 1:1 and about 1.5:1. Generally, the flow rate hydrogen gas (H$_2$) and/or an inert gas is between about 50 sccm and about 20,000 sccm.

The silicon carbide layer may also be doped with boron and/or phosphorus to improve layer properties, and generally includes less than about 15 atomic percent (atomic %) or less of dopants. Boron doping of the low k silicon carbide layer may be performed by introducing borane (BH3), or borane derivatives thereof, such as diborane (B2H6), into the chamber during the deposition process. Boron doping of the silicon carbide layer preferably comprises between about 0.1 wt. % and about 4 wt. % of boron.

Phosphorus containing dopants may be used in the processing gases at a ratio of dopant to organosilicon compound between about 1:5 or greater, such as between about 1:5 and about 1:100. Phosphorus doping of the low k silicon carbide layer may be performed by introducing phosphine (PH3), triethylphosphate (TEPO), triethoxyphosphate (TEOP), trimethyl phosphine (TMP), triethyl phosphine (TEP), and combinations thereof, into the chamber during the deposition process. It is believed that dopants may reduce the dielectric constant of the deposited silicon carbide material. The doped silicon carbide layer may comprise between about 0.1 wt. % and about 15 wt. % of phosphorus, for example, between about 1 wt. % and about 4 wt. % of phosphorus.

Silicon carbide layers may further include oxygen. Oxygen-doped silicon carbide layers typically include less than about 15 atomic percent (atomic %) of oxygen, preferably having between about 3 atomic % and about 10 atomic % of oxygen. Oxygen doped silicon carbide layers may be deposited with oxygen containing compounds including oxygen and carbon containing compounds, such as oxygen containing gases and oxygen containing organosilicon compounds. The oxygen-containing gas and the oxygen-containing organosilicon compound described herein are considered non-oxidizing gases as compared to oxygen or ozone. Materials that are described as silicon oxycarbide or carbon-doped silicon oxide generally comprises between about 15 atomic % or greater of oxygen in the layer and are deposited from oxidizing gases.

Preferred oxygen-containing gases generally have the formula $C_XH_YO_Z$, with x being between 0 and 2, Y being between 0 and 2, where X+Y is at least 1, and Z being between 1 and 3, wherein X+Y+Z is 3 or less. The oxygen-containing gas may include carbon dioxide, carbon monoxide, or combinations thereof; and may additionally include water. The oxygen-containing gas is typically an inorganic material.

Alternatively, oxygen-doped silicon carbide layers may be deposited with oxygen-containing organosilicon compounds to modify or change desired layer properties by controlling the oxygen content of the deposited silicon carbide layer. Suitable oxygen-containing organosilicon compounds include oxygen-containing aliphatic organosilicon compounds, oxygen-containing cyclic organosilicon compounds, or combinations thereof. Oxygen-containing aliphatic organosilicon compounds have linear or branched structures comprising one or more silicon atoms and one or more carbon atoms, and the structure includes silicon-oxygen bonds.

Oxygen-containing cyclic organosilicon compounds typically have a ring comprising three or more silicon atoms and the ring may further comprise one or more oxygen atoms. Commercially available oxygen-containing cyclic organosilicon compounds include rings having alternating silicon and oxygen atoms with one or two alkyl groups bonded to each silicon atom. Preferred oxygen-containing organosilicon compounds are cyclic compounds.

One class of oxygen-containing organosilicon compounds include compounds having Si—O—Si bonding groups, such as organosiloxane compounds. Compounds with siloxane bonds provide silicon carbide layers with bonded oxygen that can reduce the dielectric constant of the layer as well as reduce the current leakage of the layer.

Suitable oxygen-containing organosilicon compounds include, for example, one or more of the following compounds:

| | |
|---|---|
| Dimethyldimethoxysilane (DMDMOS), | $(CH_3)_2$—Si—$(OCH_3)_2$, |
| Diethoxymethylsilane (DEMS), | $(CH_3)$—SiH—$(OCH_3)_2$, |
| 1,3-dimethyldisiloxane, | $CH_3$—$SiH_2$—O—$SiH_2$—$CH_3$, |
| 1,1,3,3-tetramethyldisiloxane (TMDSO), | $(CH_3)_2$—SiH—O—SiH—$(CH_3)_2$, |
| Hexamethyldisiloxane (HMDS), | $(CH_3)_3$—Si—O—Si—$(CH_3)_3$, |

| | |
|---|---|
| Hexamethoxydisiloxane (HMDSO), | $(CH_3O)_3$—Si—O—Si—$(OCH_3)_3$, |
| 1,3-bis(silanomethylene)disiloxane, | $(SiH_3$—$CH_2$—$SiH_2$—$)_2$—O, |
| Bis(1-methyldisiloxanyl)methane, | $(CH_3$—$SiH_2$—O—$SiH_2$—$)_2$—$CH_2$, |
| 2,2-bis(1-methyldisiloxanyl)propane, | $(CH_3$—$SiH_2$—O—$SiH_2$—$)_2$—$C(CH_3)_2$, |
| 1,3,5,7-tetramethylcyclotetrasiloxane (TMCTS), | —(—$SiHCH_3$—O—$)_4$-(cyclic), |
| Octamethylcyclotetrasiloxane (OMCTS), | —(—$Si(CH_3)_2$—O—$)_4$-(cyclic), |
| 1,3,5,7,9-pentamethylcyclopentasiloxane, | —(—$SiHCH_3$—O—$)_5$-(cyclic), |
| 1,3,5,7-tetrasilano-2,6-dioxy-4,8-dimethylene, | —(—$SiH_2$—$CH_2$—$SiH_2$—O—$)_2$— |
| Hexamethylcyclotrisiloxane | —(—$Si(CH_3)_2$—O—$)_3$-(cyclic) |
| 1,3-dimethyldisiloxane, | $CH_3$—$SiH_2$—O—$SiH_2$—$CH_3$ |
| Hexamethylcyclotrisiloxane (HMDOS) | —(—$Si(CH_3)_2$—O—$)_3$-(cyclic), | and fluorinated hydrocarbon derivatives thereof. The above lists are illustrative and should not be construed or interpreted as limiting the scope of the invention.

When oxygen-containing organosilicon compounds and oxygen-free organosilicon compounds are used in the same processing gas, a molar ratio of oxygen-free organosilicon compounds to oxygen-containing organosilicon compounds between about 4:1 and about 1:1 is generally used. An example process for depositing an oxygen containing silicon carbide layer is disclosed in U.S. patent application Ser. No. 10/196,498, filed on Jul. 15, 2002, which is incorporated by reference to the extent not inconsistent with the claims and disclosure described herein.

An oxygen-doped silicon carbide layer may be deposited in one embodiment by supplying organosilicon compounds, such as trimethylsilane, to a plasma processing chamber at a flow rate between about 10 milligrams/minute (mgm) and about 1500 mgm, for example about 160 mgm or sccm, supplying an oxidizing gas at a flow rate between about 10 sccm and about 2000 sccm, for example, about 700 sccm, supplying a noble gas at a flow rate between about 1 scorn and about 10000 sccm, for example, about 400 sccm, maintaining a substrate temperature between about 0° C. and about 500° C., for example, about 350° C., maintaining a chamber pressure below about 500 Torr, for example, about 2.5 Torr, at about and an RF power of between about 0.03 watts/cm$^2$ and about 1500 watts/cm$^2$, for example about 200 Watts with a gas distributor may be positioned between about 200 mils and about 700 mils, for example about 320 mils, from the substrate surface.

The RF power can be provided at a high frequency such as between 13 MHz and 14 MHz or a mixed frequency of the high frequency and the low frequency. For example, a high frequency of about 13.56 MHz may be used as well as a mixed frequency of high frequency of about 13.56 MHz and low frequency of about 356 KHz. The RF power can be provided continuously or in short duration cycles wherein the power is on at the stated levels for cycles less than about 200 Hz and the on cycles total between about 10% and about 30% of the total duty cycle. Additionally, a low frequency RF power may be applied during the deposition process. For example, an application of less than about 300 watts, such as less than about 100 watts at between about 100 KHz and about 1 MHz, such as 356 KHz may be used to modify film properties, such as increase the compressive stress of a SiC film to reduce copper stress migration.

Additional materials, such as an organic compounds, may also be present during the deposition process to modify or change desired layer properties. For example, organic compounds, such as aliphatic hydrocarbon compounds may also be used in the processing gas to increase the carbon content of the deposited silicon carbide materials. Suitable aliphatic hydrocarbon compounds include compounds having between one and about 20 adjacent carbon atoms. The hydrocarbon compounds can include adjacent carbon atoms that are bonded by any combination of single, double, and triple bonds.

Suitable organic compounds may include alkenes and alkynes having two to about 20 carbon atoms, such as ethylene, propylene, acetylene, and butadiene. Further examples of suitable hydrocarbons include t-butylethylene, 1,1,3,3-tetramethylbutylbenzene, t-butylether, methyl-methacrylate (MMA), t-butylfurfurylether, and combinations thereof. Organic compounds containing functional groups including oxygen and/or nitrogen containing functional groups may also be used. For example, alcohols, including ethanol, methanol, propanol, and iso-propanol, may be used for depositing the silicon carbide material.

Silicon carbide material are generally deposited by supplying an organosilicon compound to a plasma processing chamber at a flow rate between about 10 sccm and about 1500 sccm, supplying a dopants, such as a nitrogen containing compounds including as ammonia and oxygen containing compounds, at a flow rate between about 10 sccm and about 2500 sccm, supplying additional gases, such as an inert gas and/or hydrogen, to the processing chamber at a flow rate between about 10 sccm and about 10000 sccm, respectively, maintaining the chamber at a heater temperature between about 0° C. and about 500° C., maintaining a chamber pressure between about 100 milliTorr and about 100 Torr, positioning a gas distributor between about 200 mils and about 700 mils from the substrate surface, and generating a plasma.

The plasma may be generated power levels may be by applying a power density ranging between about 0.03 W/cm$^2$ and about 6.4 W/cm$^2$, which is a RF power level of between about 10 W and about 2000 W for a 200 mm substrate, for example, between about 100 W and about 400 W at a high frequency such as between 13 MHz and 14 MHz, for example, 13.56 MHz. The plasma may be generated power levels may be by applying a power density ranging between about 0.01 W/cm$^2$ and about 2.8 W/cm$^2$, which is a RF power level of between about 10 W and about 2000 W for a 300 mm substrate, for example, between about 100 W and about 400 W at a high frequency such as between 13 MHz and 14 MHz, for example, 13.56 MHz. The RF power can be provided continuously or in short duration cycles wherein the power is on at the stated levels for cycles less than about 200 Hz and the on cycles total between about 10% and about 30% of the total duty cycle. Alternatively, all plasma generation may be performed remotely, with the generated radicals introduced into the processing chamber for plasma treatment of a deposited material or deposition of a material layer.

Alternatively, the plasma may be generated by a dual-frequency RF power source. The power may be applied from a dual-frequency RF power source a first RF power with a frequency in a range of about 10 MHz and about 30 MHz at a power, for example, in a range of about 100 watts to about 1000 watts and at least a second RF power with a frequency in a range of between about 100 KHz and about 500 KHz as well as a power, for example, in a range of about 1 watt to about 200 watts. The above process parameters provide a deposition rate for the silicon carbide layer in the range of about 500 Å/min to about 20,000 Å/min, such as a range between about 100 Å/min and about 3000 Å/min.

Suitable processing systems for performing the processes described herein are a DxZ™ chemical vapor deposition chamber or Producer™ processing system, both of which are commercially available from Applied Materials, Inc., Santa Clara, Calif.

The above process parameters provide a deposition rate for the silicon carbide layer or nitrogen doped silicon carbide layer in the range of about 500 Å/min to about 20,000 Å/min, such as a range between about 100 Å/min and about 3000 Å/min, when implemented on a 200 mm (millimeter) substrate in a deposition chamber available from Applied Materials, Inc., Santa Clara, Calif.

Ultraviolet Curing

The deposited silicon carbide material may then be cured by an ultraviolet curing process. Silicon carbide material cured using the ultraviolet curing process has shown an improved barrier layer properties and reduced and minimal resist poisoning. The ultraviolet curing process may be performed in situ within the same processing chamber or system, for example, transferred from one chamber to another without break in a vacuum. The following ultraviolet curing process is illustrative, and should not be construed or interpreted as limiting the scope of the invention.

Exposure to an ultraviolet radiation source may be performed as follows. The substrate is introduced into a chamber, which may include the deposition chamber, and a deposited silicon carbide layer, including nitrogen-doped silicon carbide materials, is exposed to between about 0.01 milliWatts/cm$^2$ and about 1 watts/cm$^2$ of ultraviolet radiation, for example, between about 0.1 milliWatts/cm$^2$ and about 10 milliwatts/cm$^2$. The ultraviolet radiation may comprise a range of ultraviolet wavelengths, and include one or more simultaneous wavelength. Suitable ultraviolet wavelengths include between about 1 nm and about 400 nm, and may further include optical wavelengths up to about 600 or 780 nm. The ultraviolet wavelengths between about 1 nm and about 400 nm, may provide a photon energy (electroVolts) between about 11.48 (eV) and about 3.5 (eV). Preferred ultraviolet wavelengths include between about 100 nm and about 350 nm.

Further, the ultraviolet radiation application may occur at multiple wavelengths, a tunable wavelength emission and tunable power emission, or a modulation between a plurality of wavelengths as desired, and may be emitted from a single UV lamp or applied from an array of ultraviolet lamps. Examples of suitable UV lamps include a Xe filled Zeridex™ UV lamp, which emits ultraviolet radiation at a wavelength of about 172 nm or the Ushio Excimer UV lamp, or a Hg Arc Lamp, which emits ultraviolet radioation at wave. The deposited silicon carbide layer is exposed to the ultraviolet radiation for between about 10 seconds and about 600 seconds.

During processing, the temperature of the processing chamber may be maintained at between about 0° C. and about 450° C., for example, between about 20° C. and about 400° C. degrees Celsius, for example about 25° C., and at a chamber pressure between vacuum, for example, less than about 1 mTorr up to about atmospheric pressure, i.e., 760 Torr, for example at about 100 Torr. The source of ultraviolet radiation may be between about 100 mils and about 600 mils from the substrate surface. Optionally, a processing gas may be introduced during the ultraviolet curing process. Suitable processing gases include oxygen ($O_2$), nitrogen ($N_2$), hydrogen ($H_2$), helium (He), argon (Ar), water vapor ($H_2O$), carbon monoxide, carbon dioxide, hydrocarbon gases, fluorocarbon gases, and fluorinated hydrocarbon gases, or combinations thereof. The hydrocarbon compounds may have the formula $C_xH_y$, $C_xF_y$, $C_xF_yH_z$, or combinations thereof, with x an integer between 1 and 6, y is an integer between 4 and 14, and z is an integer between 1 and 3.

An example of an ultraviolet process is as follows. A substrate having a nitrogen doped silicon carbide layer is exposed to ultraviolet radiation at a chamber temperature about 400° C., an applied power of about 10 mW/cm$^2$ at a wavelength of about 172 nm for about 120 seconds in an argon atmosphere at atmosphere pressure (about 760 Torr).

Alternative Post-Deposition Treatment:

The deposited silicon carbide material may also be exposed to an anneal, a plasma treatment or other post-deposition treatment process. The anneal, plasma treatment, or other process may be performed before the ultraviolet curing process, after the ultraviolet curing process, or both before and after, with the before and after combination being the same or different processes. The post-deposition treatments may be performed in situ with the deposition of the silicon carbide material without breaking vacuum in a processing chamber or processing system.

Annealing the deposited material may comprise exposing the substrate at a temperature between about 100° C. and about 400° C. for between about 1 minute and about 60 minutes, preferably at about 30 minutes, to reduce the moisture content and increase the solidity and hardness of the dielectric material. Annealing is preferably performed after the deposition of a subsequent material or layer that prevents shrinkage or deformation of the dielectric layer. The annealing process is typically formed using inert gases, such as argon and helium, but may also include hydrogen or other non-oxidizing gases. The above described annealing process is preferably used for low dielectric constant materials deposited from processing gases without meta-stable compounds. The anneal process is preferably performed prior to the subsequent deposition of additional materials. Preferably, an in-situ (i.e., inside the same chamber or same processing system without breaking vacuum) post treatment is performed.

The annealing process is preferably performed in one or more cycles using helium. The annealing process may be performed more than once, and variable amounts of helium and hydrogen may be used in multiple processing steps or annealing steps. The anneal energy may be provided by the use of heat lamps, infer-red radiation, such as IR heating lamps, or as part of a plasma anneal process. Alternatively, a RF power may be applied to the annealing gas between about 200 W and about 1,000 W, such as between about 200 W and about 800 W, at a frequency of about 13.56 MHz for a 200 mm substrate.

Alternatively, or additionally, the deposited silicon carbide layer may be plasma treated to remove contaminants or otherwise clean the exposed surface of the silicon carbide layer prior to subsequent deposition of materials thereon. The plasma treatment may be performed in the same chamber used to deposit the silicon and carbon containing material. The plasma treatment is also believed to improve film stability by forming a protective layer of a higher density material than the untreated silicon carbide material. The higher density silicon carbide material is believed to be more resistive to chemical reactions, such as forming oxides when exposed to oxygen, than the untreated silicon carbide material.

The plasma treatment generally includes providing an inert gas including helium, argon, neon, xenon, krypton, or combinations thereof, of which helium is preferred, and/or a reducing gas including hydrogen, ammonia, and combinations thereof, to a processing chamber. The inert gas or reducing gas is introduced into the processing chamber at a flow rate between about 500 sccm and about 3000 sccm, preferably between about 1000 sccm and about 2500 sccm of hydrogen, and generating a plasma in the processing chamber.

The plasma may be generated using a power density ranging between about 0.03 W/cm$^2$ and about 3.2 W/cm$^2$, which is a RF power level of between about 10 W and about 1000 W for a 200 mm substrate. Preferably, at a power level of about 100 watts for a silicon carbide material on a 200 mm substrate. The RF power can be provided at a high frequency such as between 13 MHz and 14 MHz. The RF power can be provided continuously or in short duration cycles wherein the power is on at the stated levels for cycles less than about 200 Hz and the on cycles total between about 10% and about 30% of the total duty cycle. Alternatively, the RF power may also be provided at low frequencies, such as 356 kHz, for plasma treating the depositing silicon carbide layer.

The processing chamber is preferably maintained at a chamber pressure of between about 1 Torr and about 12 Torr, for example about 3 Torr. The substrate is preferably maintained at a temperature between about 200° C. and about 450° C., preferably between about 290° C. and about 400° C., during the plasma treatment. A heater temperature of about the same temperature of the silicon carbide deposition process, for example about 290° C., may be used during the plasma treatment. The plasma treatment may be performed between about 10 seconds and about 100 seconds, with a plasma treatment between about 40 seconds and about 60 seconds preferably used. The processing gas may be introduced into the chamber by a gas distributor, the gas distributor may be positioned between about 200 mils and about 500 mils from the substrate surface. The gas distributor may be positioned between about 300 mils and about 600 mils during the plasma treatment.

The hydrogen containing plasma treatment is believed to further reduce the dielectric constant of the low k dielectric layer by about 0.1. The plasma treatment is believed to clean contaminants from the exposed surface of the silicon carbide material and may be used to stabilize the layer, such that it becomes less reactive with moisture and/or oxygen under atmospheric condition as well as the adhesion of layers formed thereover.

One example of a post deposition plasma treatment for a silicon carbide layer includes introducing ammonia at a flow rate of 950 sccm into the processing chamber, maintaining the chamber at a heater temperature of about 350° C., maintaining a chamber pressure of about 3.7 Torr, positioning a gas distributor at about 280 mils from the substrate surface, and applying a RF power of about 300 watts at 13.56 MHz for about two seconds.

However, it should be noted that the respective parameters may be modified to perform the plasma processes in various chambers and for different substrate sizes, such as 300 mm substrates. An example of a plasma treatment for a silicon and carbon containing film is further disclosed in U.S. patent application Ser. No. 09/336,525, entitled, "Plasma treatment to Enhance adhesion and to Minimize Oxidation of Carbon-Containing Layers," filed on Jun. 18, 1999, which is incorporated herein by reference to the extent not inconsistent with the disclosure and claimed aspects of the invention described herein.

Alternatively, the silicon carbide layer may also be treated by depositing a silicon carbide cap layer or silicon oxide cap layer prior to depositing a resist material. The cap layer may be deposited at a thickness between about 100 Å and about 500 Å. The use of a cap layer is more fully described in co-pending U.S. patent application Ser. No. 09/977,008, entitled "Method Of Eliminating Resist Poisoning In Damascene Applications", filed on Oct. 11, 2001, which is incorporated herein by reference to the extent not inconsistent with the claimed aspects and disclosure described herein.

Electron Beam Treatment

In another aspect of the invention, the deposited silicon carbide material may be cured by an electronic beam (e-beam) technique in addition to or as an alternative to ultraviolet radiation treatment described herein. Silicon carbide material cured using an e-beam technique has shown an unexpected reduction in k value and an unexpected increase in hardness, not capable with conventional curing techniques. The e-beam treatment may be performed in situ within the same processing system, for example, transferred from one chamber to another without break in a vacuum. The following e-beam apparatus and process are illustrative, and should not be construed or interpreted as limiting the scope of the invention.

The temperature at which the electron beam apparatus 200 operates ranges from about −200 degrees Celsius to about 600 degrees Celsius, for example, about 400 degrees Celsius. An e-beam treatment of a silicon carbide layer may comprise the application or exposure to between about 1 micro coulombs per square centimeter ($\mu C/cm^2$) and about 6,000 $\mu C/cm^2$, for example, between about 1 $\mu C/cm^2$ and about 400 $\mu C/cm^2$, and more preferably less than about 200 $\mu C/cm^2$, such as about 70 $\mu C/cm^2$, at energy ranges between about 0.5 kiloelectron volts (KeV) and about 30 KeV, for example between about 1 KeV and about 3 kiloelectron volts (KeV). The electron beams are generally generated at a pressure of about 1 mTorr to about 200 mTorr.

The gas ambient in the electron beam chamber 220 may be an inert gas, including nitrogen, helium, argon, xenon, an oxidizing gas including oxygen, a reducing gas including hydrogen, a blend of hydrogen and nitrogen, ammonia, or any combination of these gases. The electron beam current ranges from about 1 mA to about 40 mA, and more preferably from about 5 mA to about 20 mA. The electron beam may cover an area from about 4 square inches to about 700 square inches. Although any e-beam device may be used, one exemplary device is the EBK chamber, available from Applied Materials, Inc., of Santa Clara, Calif.

A general example of an e-beam process is as follows. A substrate having a 3000 Å thick layer is exposed to an e-beam at a chamber temperature about 400 degrees Celsius, an applied electron beam energy of about 3.5 KeV, and at an electron beam current of about 5 mA, with an exposure dose of the electron beam of about 500 mC/cm2.

Further description of an e-beam process for silicon carbon materials is more fully described in co-pending U.S. Pat. No. 6,790,788, issued on Sep. 14, 2004, which is incorporated herein by reference to the extent not inconsistent with the claimed aspects and disclosure described herein.

Deposition of a Barrier Layer for a Dual Damascene Structure

The ultraviolet cured silicon carbide layer, including nitrogen doped silicon carbide layers may be used as barrier layers, etch stop, and anti-reflective coating/passivation layers in damascene formation, of which use as a barrier layer is preferred. Interlayer dielectric layers for use in low k damascene formations having silicon carbide layer formed as described herein include dielectric layers having silicon, oxygen, and carbon, and a dielectric constant of less than about 3. The adjacent dielectric layers for use with the barrier layer material described herein have a carbon content of about 1 atomic percent or greater excluding hydrogen atoms, preferably between about 5 and about 30 atomic percent excluding hydrogen atoms, and have oxygen concentrations of about 15 atomic % or greater.

The adjacent dielectric layer may be deposited by oxidizing an organosiliane compound in a plasma enhanced chemical vapor deposition technique. For example, a suitable adjacent dielectric material may be deposited by reacting trimethylsilane and oxygen in a plasma enhanced chemical vapor deposition technique, with the plasma formed under conditions including a high frequency RF power density from about 0.16 W/cm$^2$ to about 0.48 W/cm$^2$. Examples of methods and uses for the adjacent dielectric layers comprising silicon, oxygen, and carbon, having a dielectric constant of less than about 3 are more further described in U.S. Pat. No. 6,054,379, issued May 25, 2000, U.S. Pat. No. 6,287,990, issued Sep. 11, 2001, and U.S. Pat. No. 6,303,523, issued on Oct. 16, 2001, which are incorporated by reference herein to the extent not inconsistent with the disclosure and claimed aspects described herein. An example of a dielectric layer comprising silicon, oxygen, and carbon, having a dielectric constant of less than about 3 is Black Diamond™ dielectric materials commercially available from Applied Materials, Inc., of Santa Clara, Calif.

The embodiments described herein for depositing silicon carbide layers adjacent low k dielectric layers are provided to illustrate the invention and the particular embodiment shown should not be used to limit the scope of the invention.

Figure 1:
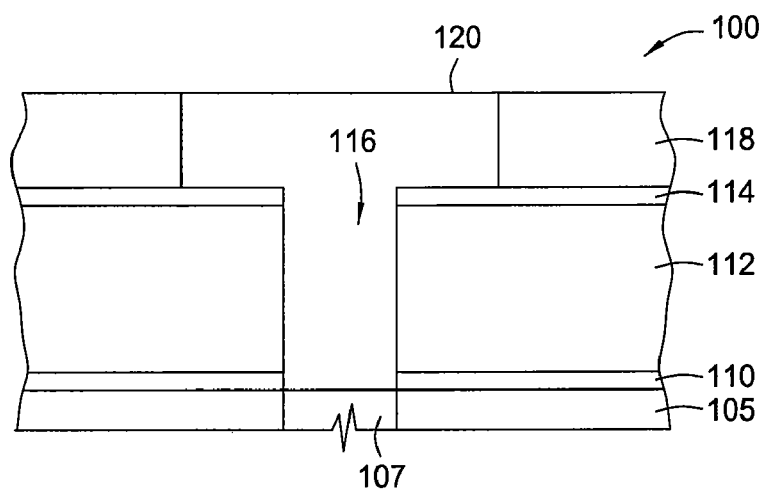
FIG. 1 is a cross sectional view showing a dual damascene structure comprising a low k barrier layer and a low k dielectric layer described herein.

An example of a damascene structure that is formed using the silicon carbide material described herein as a barrier layer is shown in FIG. 1. A silicon carbide barrier layer 110, such as nitrogen-doped silicon carbide, is deposited and post deposition treated with ultraviolet radiation as described herein on the substrate surface to eliminate inter-level diffusion between the substrate and subsequently deposited materials. The substrate surface may comprise metal features 107, such as copper features, formed in a dielectric material 105. Optionally, a second barrier layer of a oxygen containing silicon carbide layer or a phenyl containing silicon carbide layer as described herein may be deposited on the silicon carbide barrier layer 110.

A first dielectric layer 112, comprising silicon, oxygen, and carbon, as described herein, is deposited on the silicon carbide barrier layer 110. An etch stop (or second barrier layer) 114 of a silicon carbide material, such as the nitrogen and/or oxygen doped silicon carbide material described herein, is then deposited on the first dielectric layer 112 and treated with ultraviolet radiation as described herein. The etch stop 114 is then pattern etched using conventional techniques to define the openings 116 of the interconnects or contacts/vias.

A second dielectric layer 118 is then deposited over the patterned etch stop. A resist is then deposited and patterned by conventional means known in the art to define the contacts/vias openings 116. A resist material may include an energy based resist material including deep ultraviolet (DUV) resist materials as well as e-beam resist materials.

A single etch process is then performed to define the contacts/vias openings 116 down to the etch stop and to etch the unprotected dielectric exposed by the patterned etch stop to define the contacts/vias openings 116. One or more conductive materials 120 such as copper are then deposited to fill the formed contacts/vias openings 116. While not shown, an optional silicon carbide layer, may be deposited on the second dielectric layer 118 and treated with ultraviolet radiation as described herein prior to deposition of the resist material. The optional silicon carbide layer may perform as a anti-reflective coating, a passivation layer, or both. The optional silicon carbide layer is preferably a nitrogen free silicon carbide material, and the invention contemplates that a nitrogen doped silicon carbide layer with the ultraviolet curing may also be used.

A preferred dual damascene structure fabricated in accordance with the invention including a silicon carbide barrier layer deposited by the processes described herein is sequentially depicted schematically in FIGS. 2A-2H, which are cross sectional views of a substrate having the steps of the invention formed thereon.

Figure 2A:
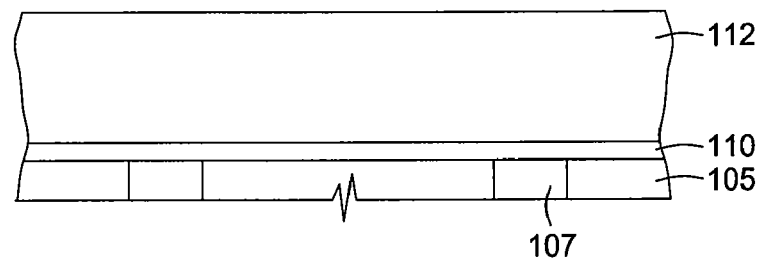
FIGS. 2A-2H are cross sectional views showing one embodiment of a dual damascene deposition sequence of the invention.

As shown in FIG. 2A, a nitrogen doped silicon carbide barrier layer 110 is deposited on the substrate surface from the processes described herein. The silicon carbide barrier layer 110 may be deposited by introducing ammonia at a flow rate of 700 sccm into the processing chamber, introducing helium at a flow rate of 1200 sccm into the processing chamber, introducing trimethylsilane (TMS) at a flow rate of about 350 sccm, maintaining the chamber at a heater temperature of about 350° C., maintaining a chamber pressure of about 3.7 Torr, positioning a gas distributor at about 280 mils from the substrate surface, and applying a RF power of about 900 watts at 13.56 MHz, to deposit a silicon carbide layer. The silicon carbide material is deposited at about 1300 Å/min by this process. The deposited silicon carbide layer has a dielectric constant of about 3.5.

The silicon carbide barrier layer 110 may then be treated to the ultraviolet curing as described herein or another or additional post deposition process, such as an anneal or e-beam or plasma treated as described herein. The ultraviolet cure treatment may be performed in situ with the deposition of the silicon carbide material. Such an ultraviolet cure treatment is believed to harden and stabilize the layer, such that it becomes less reactive with moisture and/or oxygen under atmospheric condition as well as the adhesion of layers formed thereover. An example of an ultraviolet curing includes exposing the silicon carbide barrier layer 110 exposed to ultraviolet radiation at a chamber temperature about 25° C., an applied power of about 10 mW/cm$^2$ at a wavelength of about 172 nm for about 120 seconds. Alternatively, the processing chamber is maintained at a pressure and at a heater temperature of about the pressure and heater temperature during the silicon carbide barrier deposition process during the ultraviolet curing.

Alternatively, or additionally, a capping layer (not shown) of a nitrogen free silicon carbide material may be deposited on the silicon carbide barrier layer 110. The nitrogen free silicon carbide capping layer may be deposited in situ on the silicon carbide barrier layer 110. The capping layer is preferably deposited after any e-beam or plasma treatment of silicon carbide barrier layer 110.

The first dielectric layer 112 of interlayer dielectric material is deposited on the first silicon carbide barrier layer 110 by oxidizing an organosilane or organosiloxane, such as trimethylsilane. The first dielectric layer 112 may be deposited to a thickness of about 5,000 Å to about 15,000 Å, depending on the size of the structure to be fabricated. An example of a low dielectric constant material that may be used as an interlayer dielectric material is Black Diamond™ dielectric commercially available from Applied Materials, Inc., of Santa Clara, Calif. Alternatively, the first dielectric layer may also comprise other low k dielectric material such as a low k polymer material including paralyne or a low k spin-on glass such as un-doped silicon glass (USG) or fluorine-doped silicon glass (FSG).

Figure 2B:
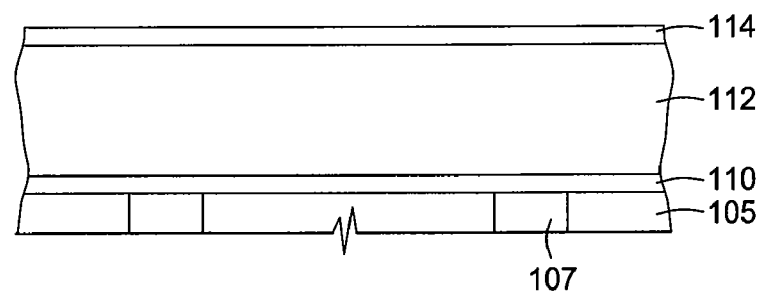

As shown in FIG. 2B, the low k etch stop 114, which may be a silicon carbide material as described herein, is then deposited on the first dielectric layer. The etch stop may be deposited to a thickness between about 200 Å and about 1000 Å. The low k etch stop 114 may be deposited from the same precursors and by the same process as the silicon carbide barrier layer 110. The low k etch stop 114 may be treated as described herein for the silicon carbide barrier layer 110. A capping layer (not shown) may also be deposited on the low k etch stop 114 as described for the silicon carbide barrier layer 100 described herein.

Figure 2C:
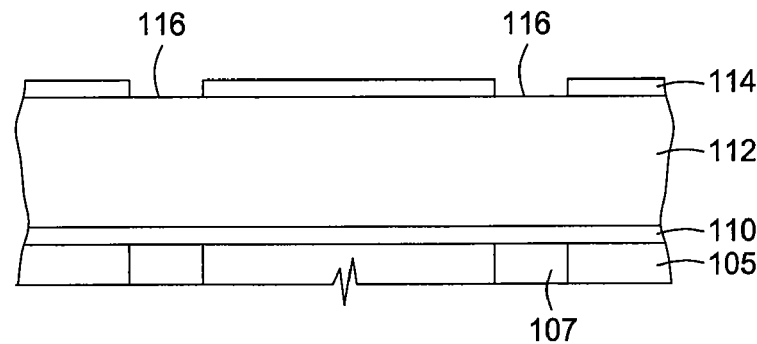

The low k etch stop 114 may then pattern etched to define the contact/via openings 116 and to expose first dielectric layer 112 in the areas where the contacts/vias are to be formed as shown in FIG. 2C. Preferably, the low k etch stop 114 is pattern etched using conventional photolithography and etch processes using fluorine, carbon, and oxygen ions. While not shown, a nitrogen-free silicon carbide or silicon oxide cap layer between about 100 Å and about 500 Å thick may be deposited on the etch stop 114 prior to depositing further materials.

Figure 2D:
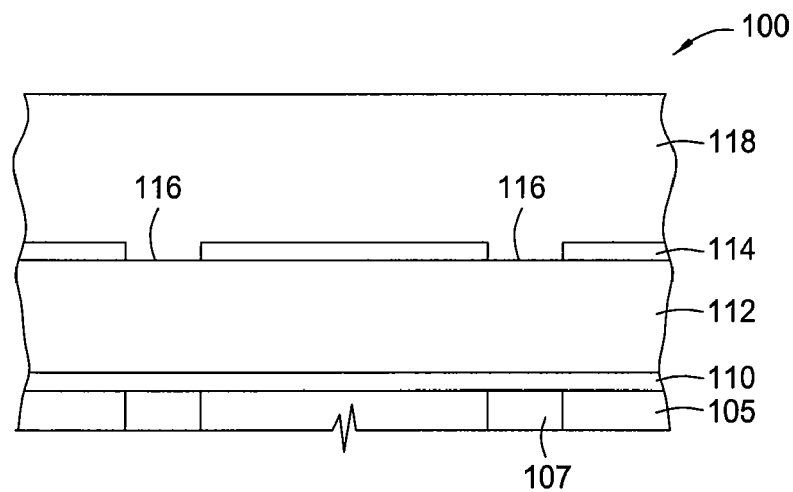

After the low k etch stop 114 has been etched to pattern the contacts/vias and the resist has been removed, a second dielectric layer 118 of silicon oxycarbide is deposited. The second dielectric layer may be deposited to a thickness between about 5,000 and about 15,000 Å as shown in FIG. 2D. The second dielectric layer 118 may be deposited as described for the first dielectric layer 112 as well as comprise the same materials used for the first dielectric layer 112. The first and second dielectric layer 118 may also be treated as described herein for silicon carbide barrier layer 110.

In an alternative embodiment, a nitrogen-free silicon carbide or silicon oxide cap layer may be deposited on second dielectric layer 118 prior to depositing additional materials, such as resist materials. Such a layer may be deposited between about 100 Å and about 500 Å thick. In a further alternative embodiment, a silicon carbide cap layer (not shown) may be deposited from the same precursors are by the same process as the silicon carbide barrier layer 110 on the second dielectric layer 118 prior to depositing additional materials, such as resist materials.

Figure 2E:
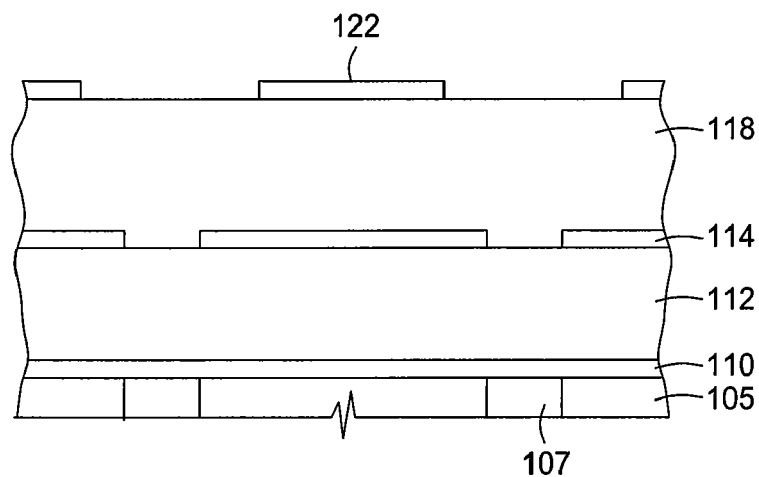
Figure 2F:
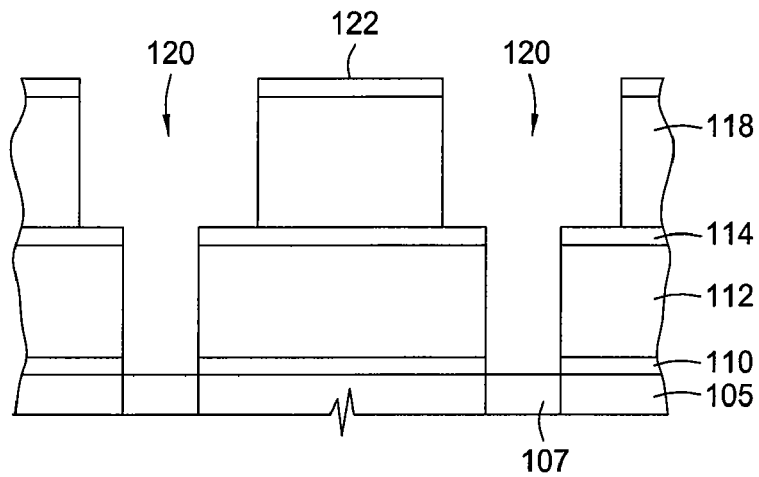

A resist material 122 is then deposited on the second dielectric layer 118 (or optional ARC layer or passivation layer as described with regard to FIG. 1) and patterned preferably using conventional photolithography processes to define the copper material 120 interconnect lines as shown in FIG. 2E. The resist material 122 comprises a material conventionally known in the art, preferably a high activation energy resist, such as UV-5, commercially available from Shipley Company Inc., of Marlborough, Mass. The interconnects and contacts/vias are then etched using reactive ion etching or other anisotropic etching techniques to define the metallization structure (ie., the interconnect and contact/via) as shown in FIG. 2F. Any resist or other material used to pattern the etch stop 114 or the second dielectric layer 118 is removed using an oxygen strip or other suitable process.

Figure 2G:
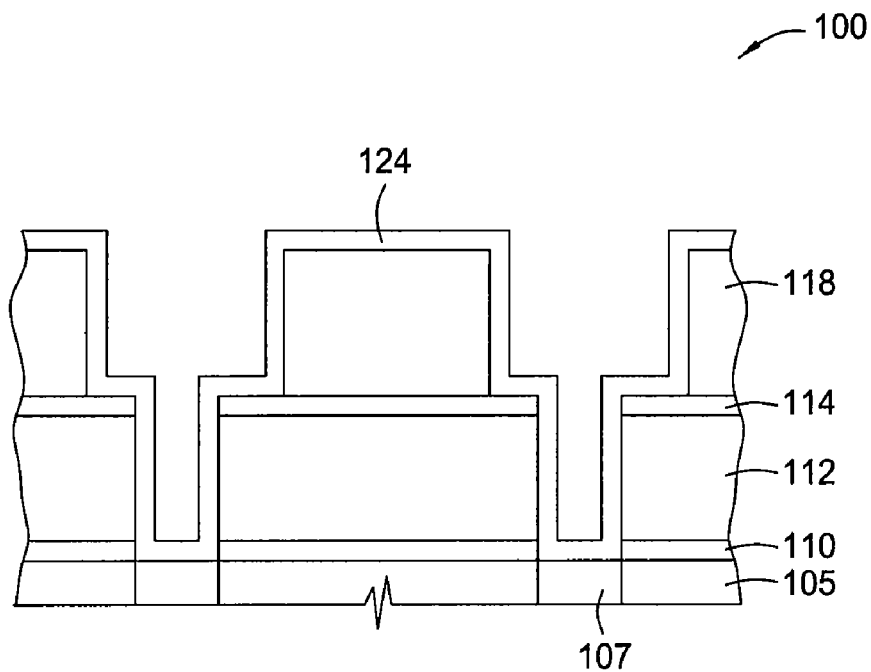
Figure 2H:
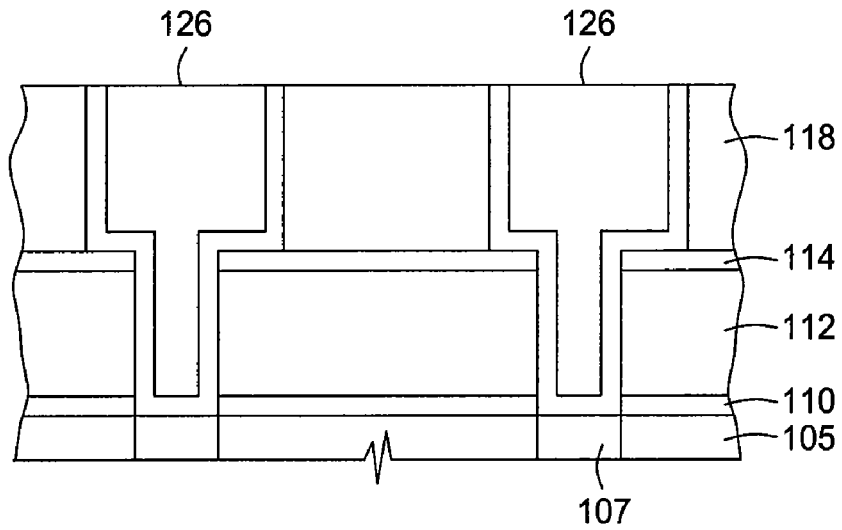

The metallization structure is then formed with a conductive material such as aluminum, copper, tungsten or combinations thereof. Presently, the trend is to use copper to form the smaller features due to the low resistivity of copper (1.7 mΩ-cm compared to 3.1 mΩ-cm for aluminum). Preferably, as shown in FIG. 2G, a suitable barrier layer 124 for copper, such as tantalum or tantalum nitride, is first deposited conformally in the metallization pattern to prevent copper migration into the surrounding silicon and/or dielectric material. Thereafter, copper 126 is deposited using chemical vapor deposition, physical vapor deposition, electroplating, or combinations thereof to form the conductive structure. Once the structure has been filled with copper or other metal, the surface is planarized using chemical mechanical polishing, as shown in FIG. 2H.

Apparatus

FIG. 3 is a plan view of one embodiment of a semiconductor tandem-chamber processing system 300 in which embodiments of the invention may be used to advantage. The arrangement and combination of chambers may be altered for purposes of performing specific fabrication process steps. Sources of the ultraviolet radiation may be disposed on various locations of the processing tool.

The tandem-chamber processing system 300 is a self-contained system having the necessary processing utilities supported on a mainframe structure 301 which can be easily installed and which provides a quick start up for operation. The tandem-chamber processing system 300 generally includes four different regions, namely, a front end staging area 302 where substrate cassettes 309 are supported and substrates are loaded into and unloaded from a loadlock chamber 312, a transfer chamber 311 housing a substrate handler 313, a series of tandem-processing chambers 306 mounted on the transfer chamber 311 and a back end 338 which houses the support utilities needed for operation of the tandem-chamber processing system 300, such as a gas panel 303, and the power distribution panel 305 for RF power generators 307. The tandem processing chambers include two processing regions 318 for processing substrates. The system can be adapted to accommodate various processes and supporting chamber hardware such as CVD, PVD, etch, and the like.

Sources of ultraviolet radiation 340, 342 may be disposed on the tandem-processing chambers 306 or the loadlock chamber 312 to integrate with a system processing regime. Alternatively, a source of ultraviolet radiation may be used in the place of one of the tandem-tandem-processing chambers 306. Further, the source of ultraviolet radiation may be position ex situ of the tandem-chamber processing system 300. The source of ultraviolet radiation may be an ultraviolet lamp, an ultraviolet laser, an ultraviolet electron beam, an ultraviolet imaging system, such as a DUV resist imaging system, or other form of ultraviolet radiation emitter.

The above apparatus is one embodiment of a Producer™ processing system, commercially available from Applied Materials, Inc., of Santa Clara, Calif., suitable for chemical vapor deposition of materials, such as the silicon carbide materials described herein. The plan-view in FIG. 3, is provided for illustrative purposes, and FIG. 3 and the corresponding description should not be interpreted or construed as limiting the scope of the invention. An example of the processing described herein is further detailed in commonly owned U.S. Pat. No. 6,591,850, issued on Jul. 15, 2003, which is incorporated by reference to the extent not inconsistent with the disclosure and claimed aspects herein.

While the foregoing is directed to preferred embodiments of the present invention, other and further embodiments of the invention may be devised without departing from the basic scope thereof, and the scope thereof is determined by the claims that follow.

The invention claimed is:
1. An apparatus for processing a substrate comprising:
 a tandem-process chamber providing two isolated processing regions; and
 an array of ultraviolet radiation sources disposed on the tandem-processing chamber, wherein the array of ultraviolet radiation sources provides ultraviolet radiation between about 0.1 milliWatts/cm$^2$ and about 1 watts/cm$^2$ at a wavelength between about 100 nm and about 400 nm.

2. The apparatus of claim 1 wherein the array of ultraviolet radiation sources comprises an ultraviolet lamp, an ultraviolet laser, an ultraviolet electron beam, or an ultraviolet imaging system.

3. The apparatus of claim 1 wherein the tandem-process chamber is coupled to a transfer chamber, and the transfer chamber is coupled to a loadlock chamber and is coupled to a backend comprising a gas panel, a power distribution panel, and a RF power generator.

4. The apparatus of claim 1, wherein the array of ultraviolet radiation sources is an array of Xe filled ultraviolet lamps.

5. The apparatus of claim 1, further comprising:
an annealing chamber disposed adjacent to the tandem-process chamber and having one or more radiation sources.

6. A tandem-chamber processing apparatus for processing a substrate comprising:
one or more tandem processing chambers each providing two isolated processing regions for processing the substrate; and
a first ultraviolet radiation source disposed adjacent to the one or more tandem processing chambers and being in heat communication with the two isolated processing regions, the first ultraviolet radiation source includes a first array of ultraviolet lamps providing a tunable wavelength emission and tunable power emission.

7. The apparatus of claim 6, further comprising:
a second ultraviolet radiation source disposed adjacent to the one or more tandem processing chambers and being in heat communication with the two isolated processing regions, the second ultraviolet radiation source includes a second array of ultraviolet lamps providing a tunable wavelength emission and tunable power emission.

8. The apparatus of claim 7, wherein the first and second arrays of ultraviolet lamps are configured to emit ultraviolet radiation at a wavelength different from each other.

9. The apparatus of claim 7, wherein the first and second arrays of ultraviolet lamps are configured to emit ultraviolet radiation at multiple wavelengths.

10. The apparatus of claim 6, wherein the one or more tandem-process chamber is disposed on or coupled to a transfer chamber.

11. The apparatus of claim 7, wherein the first and second ultraviolet radiation sources are disposed on the one or more tandem processing chambers.

12. The apparatus of claim 7, wherein each of the first and second ultraviolet radiation sources provides ultraviolet radiation between about 0.01 milliWatts/cm$^2$ and about 10 milliwatts/cm$^2$ at a wavelength of between about 100 nm and about 780 nm.

13. The apparatus of claim 7, wherein the first and second ultraviolet radiation sources comprise an ultraviolet lamp, an ultraviolet laser, an ultraviolet electron beam, or an ultraviolet imaging system.

14. The apparatus of claim 7, wherein the first and second arrays of ultraviolet lamps are Xe filled ultraviolet lamps.

15. The apparatus of claim 6, further comprising:
an annealing chamber disposed adjacent to the one or more tandem processing chambers and having one or more radiation sources for treating the substrate.

16. An apparatus for processing a substrate comprising:
a tandem-process chamber providing two isolated processing regions for processing a substrate on which a nitrogen doped dielectric material comprising silicon and carbon is deposited; and
an array of ultraviolet radiation sources disposed adjacent to the tandem-process chamber and being in heat communication with the two isolated processing regions, wherein the array of ultraviolet radiation sources is configured to cure the nitrogen doped dielectric material.

17. The apparatus of claim 16, wherein the nitrogen doped dielectric material is a nitrogen doped silicon carbide.

18. The apparatus of claim 16, wherein the array of ultraviolet radiation sources cures the nitrogen doped dielectric material by exposing the substrate with ultraviolet radiation of between about 0.01 milliWatts/cm$^2$ and about 10 milliwatts/cm$^2$ at a wavelength of between about 1 nm and about 780 nm.

19. The apparatus of claim 18, wherein the ultraviolet radiation is provided at a wavelength of between about 100 nm and about 350 nm.

* * * * *